(12) United States Patent
Yamaguchi et al.

(10) Patent No.: US 9,618,813 B2
(45) Date of Patent: Apr. 11, 2017

(54) DISPLAY DEVICE

(71) Applicant: Japan Display Inc., Minato-ku (JP)

(72) Inventors: Yohei Yamaguchi, Tokyo (JP); Arichika Ishida, Tokyo (JP); Hidekazu Miyake, Tokyo (JP); Hiroto Miyake, Tokyo (JP); Isao Suzumura, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/990,201

(22) Filed: Jan. 7, 2016

(65) Prior Publication Data

US 2016/0209719 A1  Jul. 21, 2016

(30) Foreign Application Priority Data

Jan. 15, 2015 (JP) .................................. 2015-005828

(51) Int. Cl.
| | | |
|---|---|---|
| *G02F 1/1362* | (2006.01) | |
| *H01L 29/786* | (2006.01) | |
| *H01L 27/12* | (2006.01) | |
| *G02F 1/1368* | (2006.01) | |

(52) U.S. Cl.
CPC ...... *G02F 1/136209* (2013.01); *G02F 1/1368* (2013.01); *G02F 1/136227* (2013.01); *H01L 27/1225* (2013.01); *H01L 29/7869* (2013.01); *H01L 29/78633* (2013.01)

(58) Field of Classification Search
CPC ........... H01L 29/78633; H01L 29/7869; H01L 27/124; G02F 1/1368
USPC ....... 257/223, 227, 291, 292, 439, 443, 655, 257/E27.1, E27.125, E27.112, E29.117, 257/E29.145, E29.147, E29.151, 257/E29.182, E29.202, 257/E29.273–E29.299, E29.314, E29.32, 257/E23.016
See application file for complete search history.

(56) References Cited

U.S. PATENT DOCUMENTS

| | | | | |
|---|---|---|---|---|
| 2005/0088596 A1* | 4/2005 | Shimizu | ................. | G02F 1/1362 349/139 |
| 2008/0048190 A1* | 2/2008 | Ishii | .................. | G02F 1/136209 257/71 |
| 2008/0143664 A1* | 6/2008 | Nakagawa | ............ | G02F 1/1368 345/92 |
| 2012/0298983 A1* | 11/2012 | Chang | ............... | H01L 29/78633 257/43 |

(Continued)

FOREIGN PATENT DOCUMENTS

JP   2005-223015   8/2005

*Primary Examiner* — David Vu
*Assistant Examiner* — Jonathan Han
(74) *Attorney, Agent, or Firm* — Oblon, McClelland, Maier & Neustadt, L.L.P.

(57) ABSTRACT

According to one embodiment, a display device includes an insulating substrate, a thin-film transistor including a semiconductor layer formed on a layer above the insulating substrate, a gate electrode which at least partly overlaps the semiconductor layer, and a first electrode and a second electrode which are electrically connected to the semiconductor layer, and a light shielding layer formed between the thin-film transistor and the insulating substrate to at least partly overlap the semiconductor layer, the light shielding layer electrically connected to the gate electrode.

7 Claims, 11 Drawing Sheets

(56) References Cited

U.S. PATENT DOCUMENTS

2013/0037870 A1* 2/2013 Furukawa ......... G02F 1/136209
          257/288
2015/0187823 A1* 7/2015 Miyairi ............... H01L 27/1225
          257/43

* cited by examiner

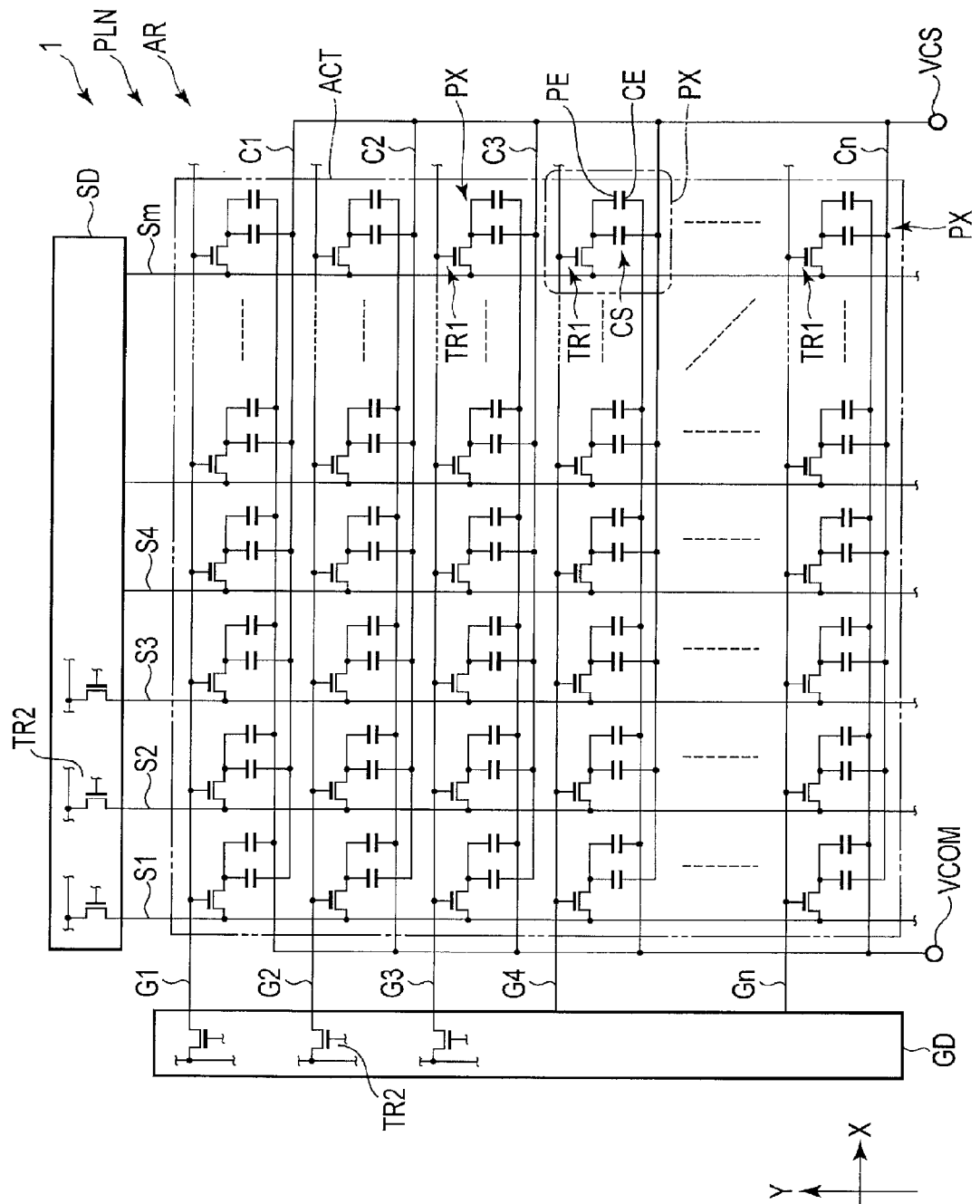
F I G. 1

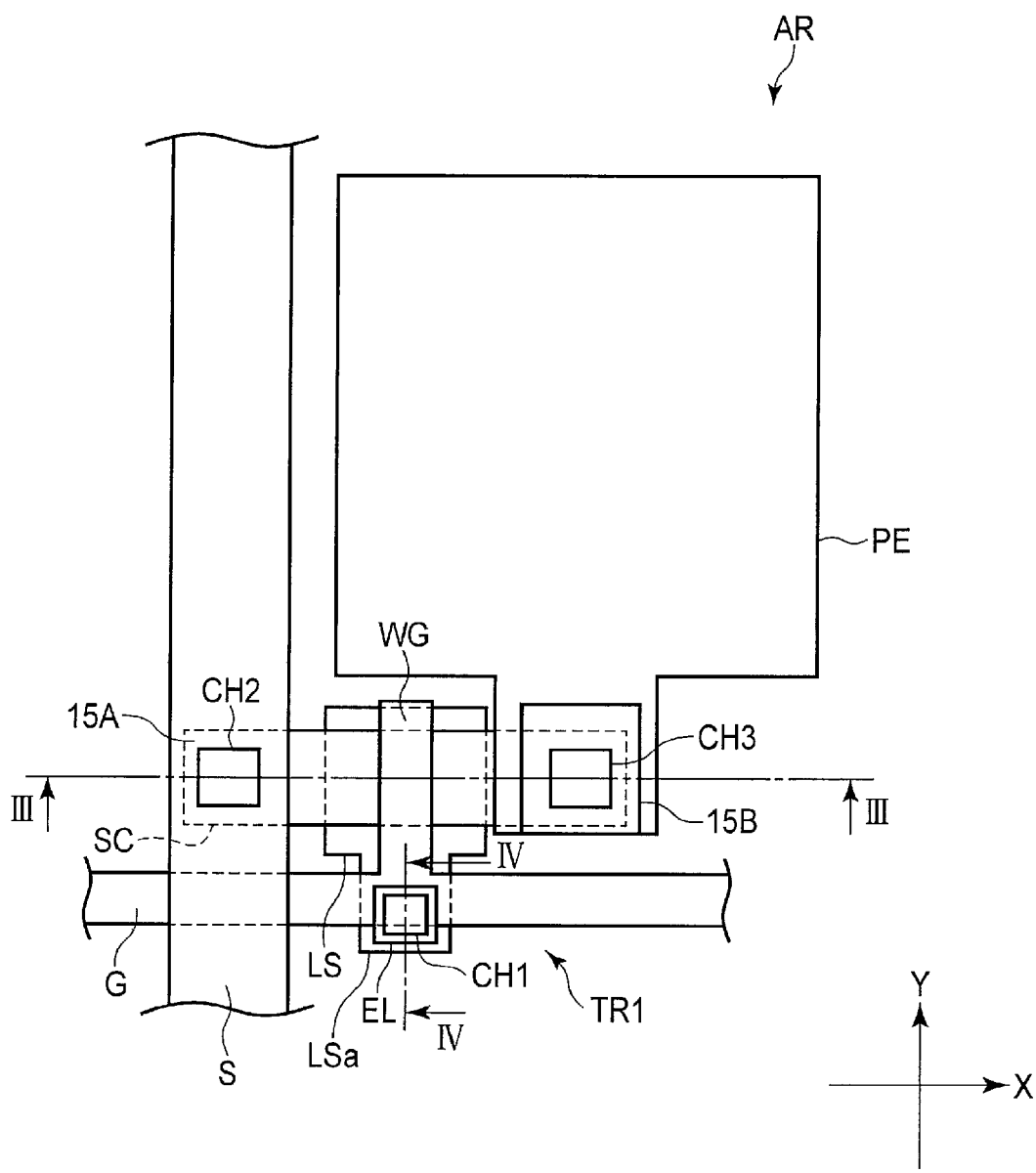
F I G. 2

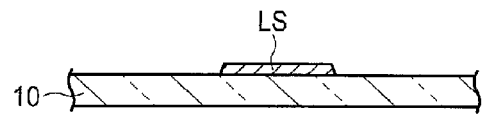 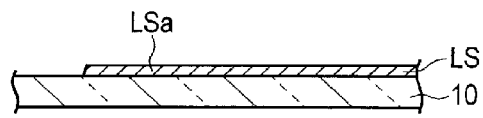
F I G. 5A    F I G. 5B
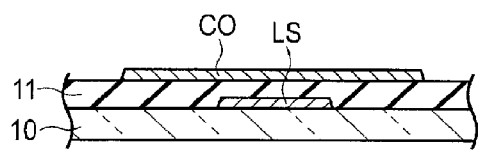 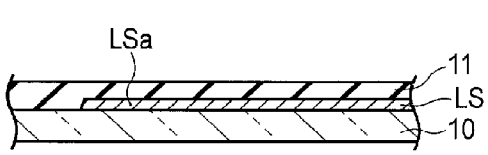
F I G. 6A    F I G. 6B
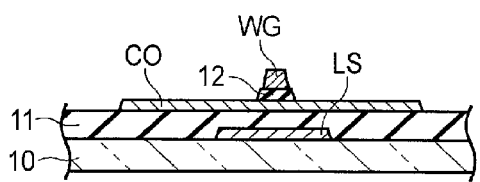 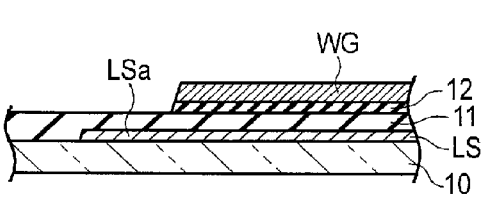
F I G. 7A    F I G. 7B

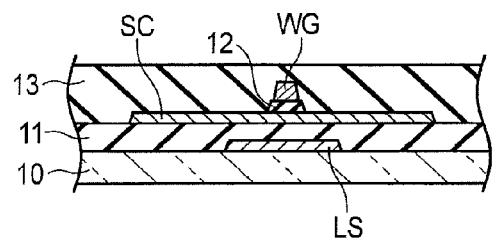
F I G. 8A
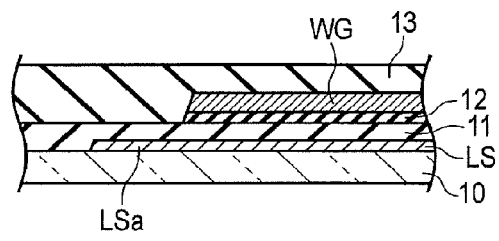
F I G. 8B
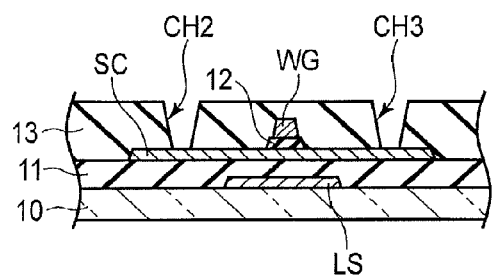
F I G. 9A
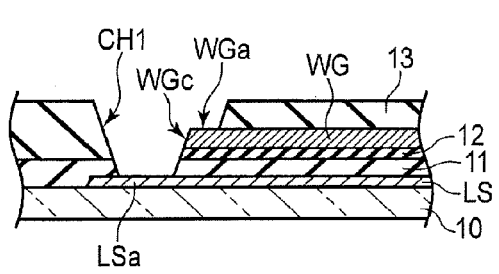
F I G. 9B
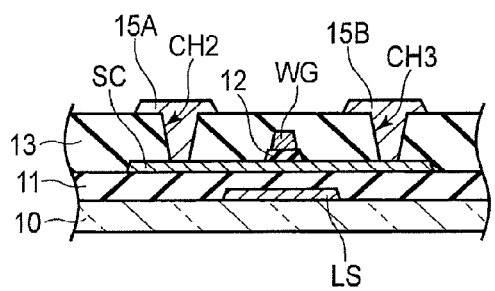
F I G. 10A
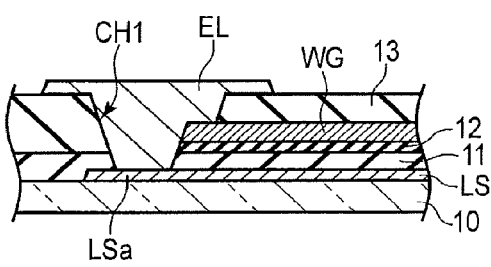
F I G. 10B

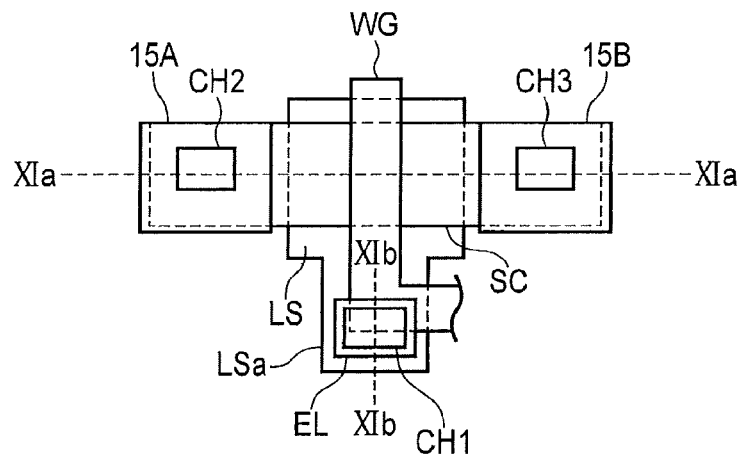
F I G. 11A
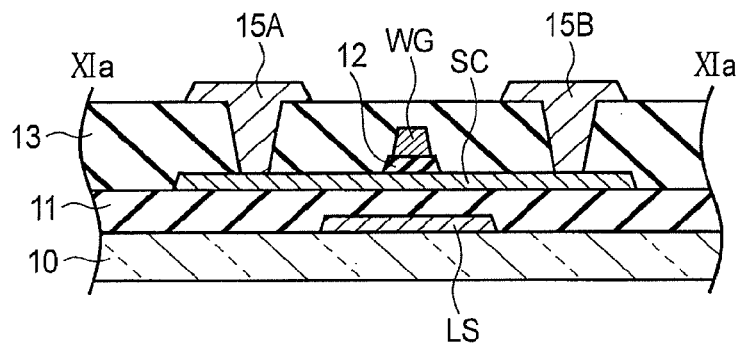
F I G. 11B
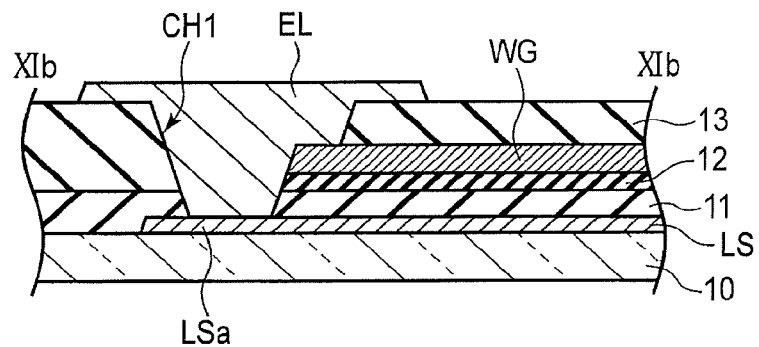
F I G. 11C

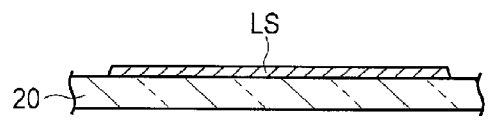 
F I G. 15A  F I G. 15B
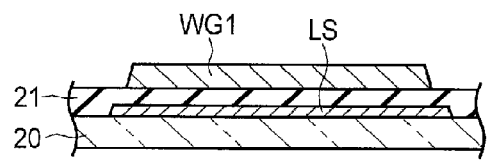 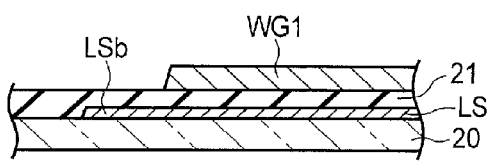
F I G. 16A  F I G. 16B
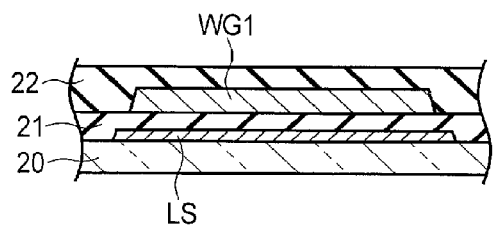 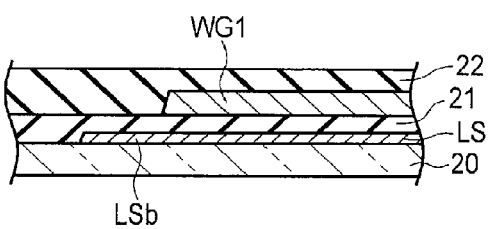
F I G. 17A  F I G. 17B

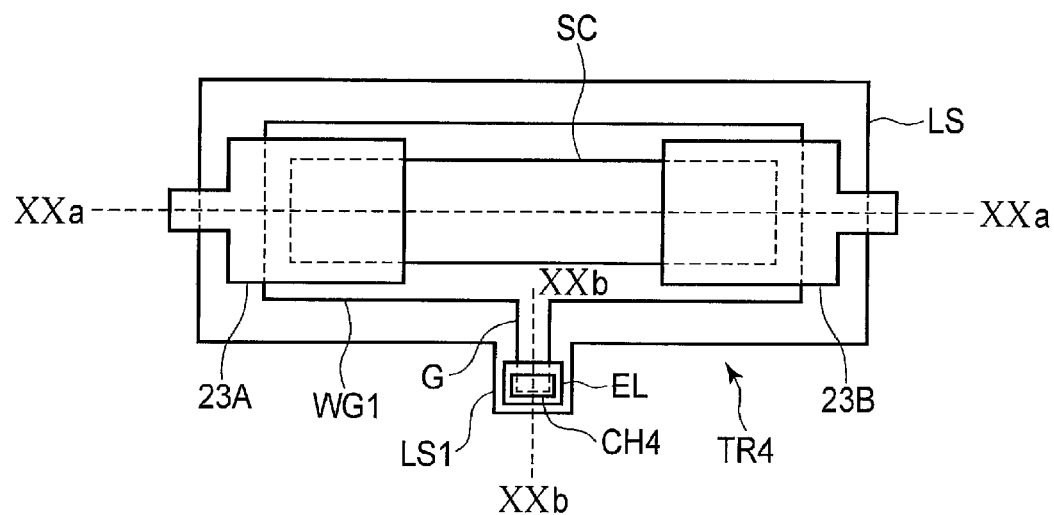
F I G. 20A
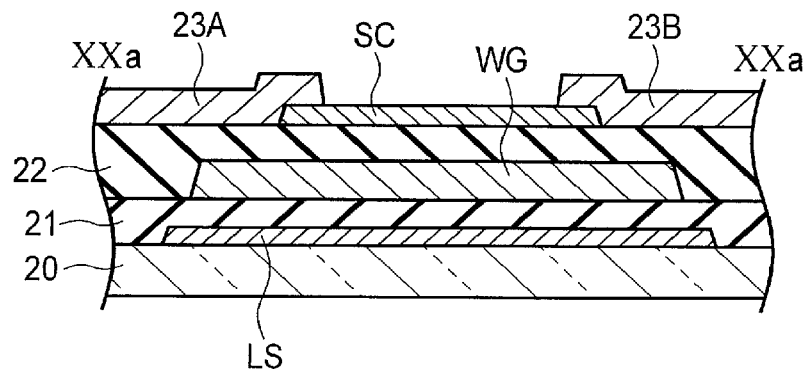
F I G. 20B
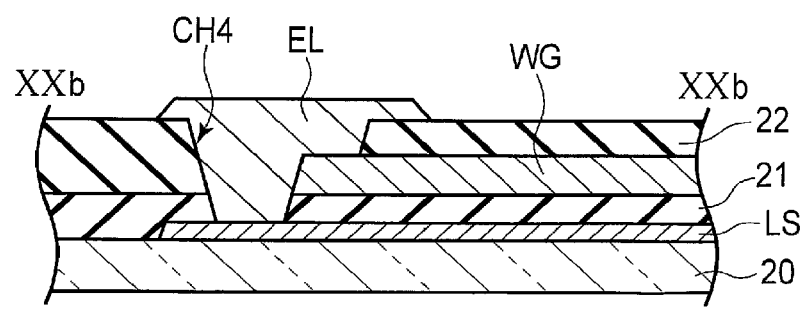
F I G. 20C

DISPLAY DEVICE

CROSS-REFERENCE TO RELATED APPLICATIONS

This application is based upon and claims the benefit of priority from Japanese Patent Application No. 2015-005828, filed Jan. 15, 2015, the entire contents of which are incorporated herein by reference.

FIELD

Embodiments described herein relate generally to a display device.

BACKGROUND

In active matrix display devices, a thin-film transistor (TFT) is used as a switching element of a pixel. A thin-film transistor is also used as a switching element of a driver formed in a frame area (non-display area) outside an active area (display area).

The thin-film transistor includes a semiconductor layer. When light is incident on the semiconductor layer, light leakage current is produced. The light leakage current may decrease the contrast, and the performance of the display device may be deteriorated. To suppress such performance deterioration of the display device by the light leakage current, there is a well-known technique of forming a light shielding layer on an array substrate.

Furthermore, a light shielding layer in a floating state causes a back gate effect on a thin-film transistor. To suppress the back gate effect, there is a well-known technique of electrically connecting the light shielding layer to other components.

BRIEF DESCRIPTION OF THE DRAWINGS

FIG. 1 is a plan view which shows the structure of a display device and an equivalent circuit of an embodiment.

FIG. 2 is a plan view which shows an array substrate of FIG. 1 in a partly enlarged manner.

FIGS. 5A and 5B are cross-sectional views which shows a manufacturing method of a thin-film transistor of FIGS. 3 and 4.

FIGS. 6A and 6B are cross-sectional views which shows the manufacturing method of the thin-film transistor of FIGS. 3 and 4, subsequently to FIG. 5.

FIGS. 7A and 7B are cross-sectional views which shows the manufacturing method of the thin-film transistor of FIGS. 3 and 4, subsequently to FIG. 6.

FIGS. 8A and 8B are cross-sectional views which shows the manufacturing method of the thin-film transistor of FIGS. 3 and 4, subsequently to FIG. 7.

FIGS. 9A and 9B are cross-sectional views which shows the manufacturing method of the thin-film transistor of FIGS. 3 and 4, subsequently to FIG. 8.

FIGS. 10A and 10B are cross-sectional views which shows the manufacturing method of the thin-film transistor of FIGS. 3 and 4, subsequently to FIG. 9.

FIGS. 11A, 11B and 11C include plan views and cross-sectional views of a thin-film transistor of a display device of a first variation.

FIGS. 15A and 15B are cross-sectional views which shows a manufacturing method of a thin-film transistor of FIGS. 13 and 14.

FIGS. 16A and 16B are cross-sectional views which shows the manufacturing method of the thin-film transistor of FIGS. 13 and 14, subsequently to FIG. 15.

FIGS. 17A and 17B are cross-sectional views which shows the manufacturing method of the thin-film transistor of FIGS. 13 and 14, subsequently to FIG. 16.

FIGS. 20A, 20B and 20C include plan views and cross-sectional views of a thin-film transistor of a display device of a third variation.

DETAILED DESCRIPTION

Figure 3:
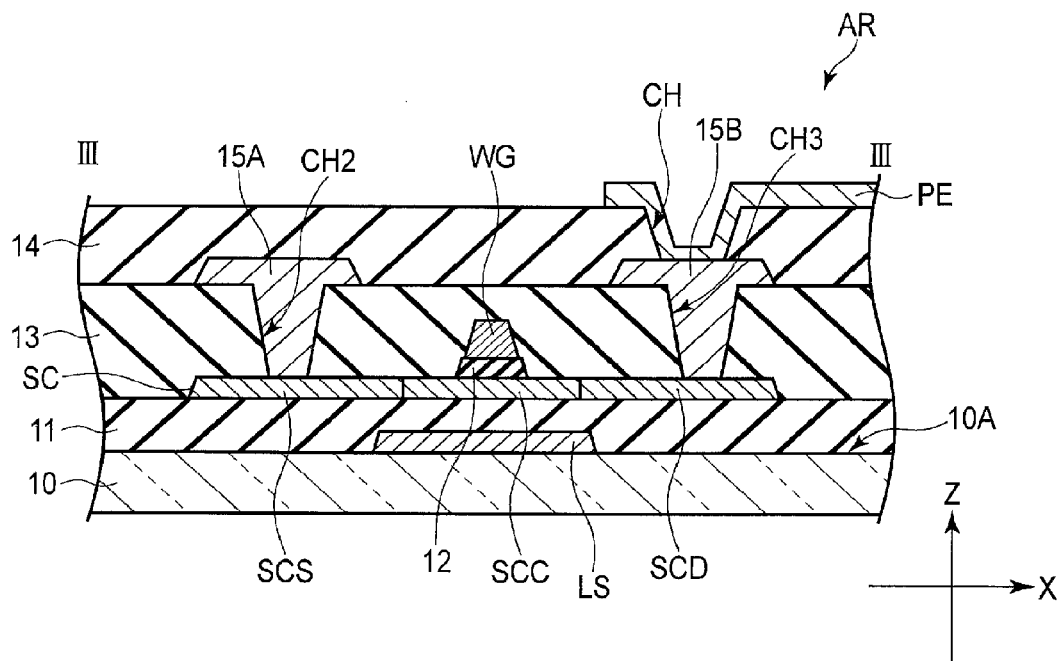
FIG. 3 is a cross-sectional view which shows the array substrate taken along line III-III of FIG. 2.

In general, according to one embodiment, a display device includes an insulating substrate, a thin-film transistor including a semiconductor layer formed on a layer above the insulating substrate, a gate electrode which at least partly overlaps the semiconductor layer, and a first electrode and a second electrode which are electrically connected to the semiconductor layer, and a light shielding layer formed between the thin-film transistor and the insulating substrate to at least partly overlap the semiconductor layer, the light shielding layer electrically connected to the gate electrode.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

FIG. 1 is a plan view which shows the structure of a display device 1 and an equivalent circuit of the present embodiment. In the following description, a liquid crystal display device is given as an example of the display device with a thin-film transistor.

As shown in FIG. 1, the display device 1 includes an active are (display area) ACT used for image display and a frame area (non-display area) outside the active area ACT. The display device 1 includes a liquid crystal display panel PLN. The liquid crystal display panel PLN includes an array substrate AR, countersubstrate (described later), and liquid crystal layer. In the active area ACT, the array substrate AR includes n gate lines G (G1 to Gn), n auxiliary capacitance lines C (C1 to Cn), m source lines S (S1 to Sm), and pixels PX in an m×n matrix. Each pixel PX is defined by two adjacent gate lines G and two adjacent source lines S.

Gate lines G and auxiliary capacitance lines C extend substantially parallel to each other in a first direction X. Note that the gate lines G and auxiliary capacitance lines C do not necessarily extend linearly. The gate lines G and auxiliary capacitance lines C are arranged in a second direction Y alternately. Source lines S extend substantially parallel to each other in the second direction Y. The source lines S are substantially orthogonal to the gate lines G and auxiliary capacitance lines C. Note that the source lines S do not necessarily extend parallel to each other. Note that the gate lines G, auxiliary capacitance lines C, and source lines S may be formed to partly bend. The gate lines G, source lines S, and auxiliary capacitance lines C may be formed of molybdenum, chrome, tungsten, aluminum, copper, titanium, nickel, tantalum, and silver, or may be formed of an alloy of such elements; however, no limitation is intended thereby. They may be formed of other metals, alloys, or a layered film of such metals and alloys.

Each gate line G extends outside the active area ACT and is connected to a gate driver GD. Each source line S extends outside the active area ACT and is connected to a source driver SD. Each auxiliary capacitance line C extends outside the active area ACT and is electrically connected to a voltage applier VCS to which an auxiliary capacitance voltage is applied.

Each pixel PX includes a thin-film transistor TR1, pixel electrode PE, common electrode CE, and retention capacitance CS. The pixel electrode PE is electrically connected to a source line S via thin-film transistor TR1. The common electrode PE is opposed to the pixel electrode PE with the liquid crystal layer interposed therebetween. The common electrode CE is electrically connected to a power supplier VCOM disposed outside the active area ACT. The retention capacitance CS is electrically connected to the pixel electrode PE.

Thin-film transistor TR1 is switched between conductive (on) and nonconductive (off) by control signals supplied from the gate driver GD through the gate line G. Image signals output from the source driver SD are supplied to the pixel electrode PE through the source line S and conductive thin-film transistor TR1. The voltage applied to the liquid crystal layer is controlled by a potential difference between the common electrode CE which is set to the common voltage and the pixel electrode PE.

Note that, although the structure of the display panel PNL is not detailed here, display modes used therein include the following examples. In a display device which mainly uses a vertical field display mode such as twisted nematic (TN) mode, optically compensated bend (OCB) mode, and vertically aligned (VA) mode, the pixel electrode PE is provided with the array substrate AR while the common electrode CE is provided with the countersubstrate CT. In a display device which mainly uses a transverse field display mode such as in-plane switching (IPS) mode and fringe field switching (FFS) mode, both the pixel electrode PE and the common electrode CE are provided with the array substrate AR.

The retention capacitance CS retains the voltage applied to the liquid crystal layer for a certain period of time, and is composed of a pair of electrodes opposed to each other with an insulating layer interposed therebetween. For example, in the retention capacitance CS, one electrode is part of the auxiliary capacitance line or an auxiliary electrode which is electrically connected to the auxiliary capacitance line CS, and the other electrode is an auxiliary counterelectrode which is connected to the pixel electrode PE.

The gate driver GD and the source driver SD are formed in the frame area. Each of the gate driver GD and the source driver SD includes a plurality of thin-film transistors TR2 which function as switching elements.

FIG. 2 is a plan view which shows the array substrate AR in a partly enlarged manner. Note that, in the figure, only the main parts which are necessary for the explanation are depicted out of the entire structure of the array substrate AR. Thin-film transistor TR1 of the structure of FIG. 2 is of a top-gate type.

As shown in FIG. 2, the array substrate AR includes the source line S, gate line G, pixel electrode PE, semiconductor layer SC, light shielding layer LS, connection electrode EL, and the like.

The gate line G extends in the first direction X. The source line S extends in the second direction Y to cross the gate line G.

Thin-film transistor TR1 is disposed in the proximity of a crossing point of the gate line G and the source line S, and is electrically connected to the gate line G and the source line S. Thin-film transistor TR1 includes the semiconductor layer SC, gate electrode WG which is formed integrally with the gate line G, source electrode (first electrode) 15A which is formed integrally with the source line S, and drain electrode (second electrode) 15B. The semiconductor layer SC is formed in a rectangular shape having its long sides along the first direction X and short sides along the second direction Y. The source electrode 15A is electrically connected to the semiconductor layer SC through a contact hole (second contact hole) CH2. The drain electrode 15B is formed in an island shape, and is electrically connected to the semiconductor layer SC through a contact hole (third contact hole) CH3. The gate electrode WG projects from the gate line G in the second direction Y and is disposed on the upper layer of the semiconductor layer SC.

In the example depicted, the pixel electrode PE is formed in a substantial rectangular shape having its long sides in the first direction X and short sides in the second direction Y. The pixel electrode PE contacts the drain electrode 15B of thin-film transistor TR1 through a contact hole which is not shown.

The light shielding layer LS overlaps the semiconductor layer SC and the gate electrode WG. A projection LSa is formed on the light shielding layer LS to project from the area overlapping the gate electrode WG. Projection LSa extends in a direction (second direction Y) which is orthogonal to the longitudinal direction (first direction X) of the semiconductor layer SC, and extends in a direction opposite to the pixel electrode PE from the light shielding layer LS. In the present embodiment, projection LSa extends in the area overlapping the gate line G.

The connection electrode EL is formed in an island shape and is electrically connected to the gate electrode WG and the light shielding layer LS through a contact hole (first contact hole) CH1 formed on projection LSa. That is, the gate electrode WG and the light shielding layer LS are electrically connected to each other by the connection electrode EL. The connection electrode EL contacts, as described later, a side surface and the upper surface of projection LSa.

FIG. 3 is a cross-sectional view which shows the array substrate AR taken along line III-III of FIG. 2.

As shown in FIG. 3, the array substrate AR further includes an insulating substrate 10, first insulating film 11, and fourth insulating film 14, and the like.

The insulating substrate 10 is formed of a light-transmissive and insulative material such as glass, resin, or the like. Here, the upper surface 10A of the insulating substrate 10 is a surface parallel to the X-Y plane which is defined by the first direction X and the second direction Y orthogonal to each other. A third direction Z is the normal to the main surface of the insulating substrate 10 and is vertical to both the first direction X and the second direction Y.

The light shielding layer LS is formed in the upper surface 10A of the insulating substrate 10. The light shielding layer LS is covered with the first insulating film 11. Thin-film transistor TR1 is formed above the light shielding layer LS to function as a switching element. Thin-film transistor TR1 includes the semiconductor layer SC, second insulating film 12, gate electrode WG, third insulating film 13, source electrode (first electrode) 15A, and drain electrode (second electrode) 15B.

The semiconductor layer SC is formed on a layer above the insulating substrate 10, and in the present embodiment, is formed on the first insulating film 11.

The semiconductor layer SC includes a source region SCS, drain region SCD, and channel region SCC. The channel region SCC is disposed between the source region SCS and the drain region SCD. The source region SCS and the drain region SCD are formed to have lower resistance as compared to the channel region SCC. The light shielding layer LS is formed between thin-film transistor TR1 and the insulating substrate 10, and is opposed to at least the channel region SCC of the semiconductor layer SC.

In the present embodiment, the semiconductor layer SC is formed of an oxide semiconductor. Such an oxide semiconductor may preferably be an oxide containing at least one of indium, gallium, and zinc. As typical examples of the oxide semiconductor, there are indium gallium zinc oxide (IGZO), indium gallium oxide (IGO), indium zinc oxide (IZO), zinc stannic oxide (ZnSnO), and zinc oxide (ZnO), for example.

The second insulating film 12 is formed on the semiconductor layer SC. The second insulating film 12 should be formed of an inorganic material which does not easily cause a defect such as a short-circuit even in a thin-film state to function as a gate insulating film. Such an inorganic material may be silicon oxide, silicon nitride, or the like; however, it is not limited thereto, and may be an oxide material such as aluminum, hafnium, or yttrium, or a layered film containing such oxide materials.

The gate electrode WG is formed on the second insulating film 12. The gate electrode WG overlaps the channel region SCC of the semiconductor layer. The third insulating film 13 (second insulating film) is formed on the gate electrode WG. In the present embodiment, the third insulating film 13 are formed on the semiconductor layer SC and the gate electrode WG, and covers a side surface of the second insulating film 12. The third insulating film 13 covers the second insulating film 12. Contact holes CH2 and CH3 are formed on the third insulating film 13. Contact holes CH2 and CH3 extend in the third direction Z and pass through the third insulating film 13.

The source electrode 15A is formed on the third insulating film 13 and passes through contact hole CH2 to contact the semiconductor layer SC. The drain electrode 15B is formed on the third insulating film 13 and passes through contact hole CH3 to contact the semiconductor layer SC.

The gate electrode WG, source electrode 15A, and drain electrode 15B are formed of a metal such as molybdenum, tungsten, aluminum, titanium, and copper or of an alloy of such metals.

The fourth insulating film 14 covers the third insulating film 13, source electrode 15A, and drain electrode 15B. A contact hole CH is formed in the fourth insulating film 14. The pixel electrode PE is formed on the fourth insulating film 14 and passes through the contact hole CH to contact the drain electrode 15B.

Figure 4:
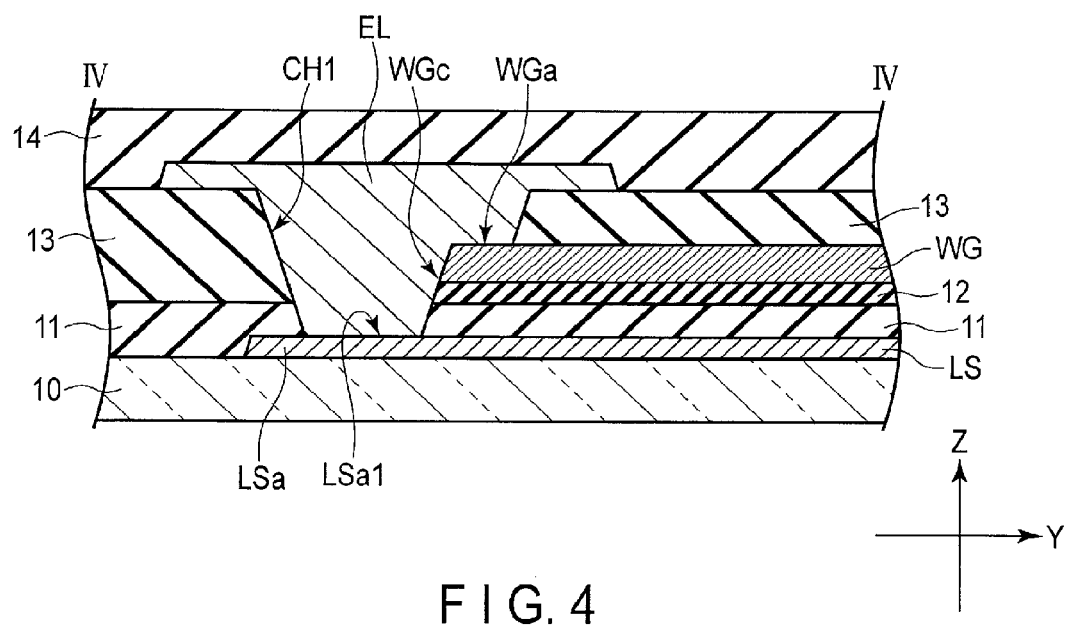
FIG. 4 is a cross-sectional view which shows the array substrate taken along line IV-IV of FIG. 2.

FIG. 4 is a cross-sectional view which shows the array substrate AR taken along line IV-IV of FIG. 2.

A contact hole CH1 is formed to pass through the first insulating film 11 and the third insulating film 13. The connection electrode EL is formed on the upper surface of the third insulating film 13 to fill in contact hole CH1. Contact hole CH1 is formed to expose the upper surface WGa and a side surface Gc of the gate electrode WG, and the connection electrode EL contacts the upper surface WGa and the side surface WGc of the gate electrode WG in contact hole CH1. As shown in FIG. 1, the connection electrode EL contacts the upper surface LSa1 of projection LSa of the light shielding layer LS. That is, the gate electrode WG1 and the light shielding layer LS are electrically connected by the connection electrode EL, and the potential of the light shielding layer LS is fixed to be substantially equal to that of the gate electrode WG. In the present embodiment, the connection electrode EL, source electrode 15A and, the drain electrode 15B are formed of the same material. The fourth insulating film 14 covers the connection electrode EL.

Now, a manufacturing process of the array substrate AR will be explained with reference to FIGS. 5 to 10. FIGS. 5 to 10 are cross-sectional views which show a manufacturing method of the array substrate AR of the present embodiment. In the manufacturing process of each of FIGS. 5 to 10, FIGS. 5A, 6A, and 7A are cross-sectional views of the array substrate AR of FIG. 2 taken along line III-III, and FIGS. 5B, 6B, and 7B are cross-sectional views of the array substrate AR of FIG. 2 taken along line IV-IV.

As shown in the FIGS. 5A and 5B, the light shielding layer LS is formed on the insulating substrate 10. The light shielding layer LS is formed through, for example, a photolithography and etching process of a tungsten silicide film.

FIG. 6 shows that the process proceeds to the formation of an oxide semiconductor layer CO. The first insulating film 11 is formed on the insulating substrate 10 to cover the light shielding layer LS. After the formation of the first insulating film 11, thin-film transistor TR1 is formed on the first insulating film 11 as shown in FIG. 6A. To form thin-film transistor TR1, an oxide semiconductor film such as IGZO is first formed on the first insulating film 11 through a sputtering method, and then, the oxide semiconductor film is patterned in an island shape to form the oxide semiconductor layer CO.

FIG. 7 shows that the process proceeds to the formation of the gate electrode WG. To form the second insulating film 12, an insulating film is formed on the first insulating film 11 and the oxide semiconductor layer CO. Then, a metal film used for the formation of the gate electrode WG is formed on the insulating film. The insulating film and the metal film are formed through a sputtering method or a plasma chemical vapor deposition (CVD) method, for example. Then, the insulating film and the metal film are patterned in an island shape altogether such that the insulating film matures into the second insulating film 12 and the metal film matures into the gate electrode WG. Then, the oxide semiconductor layer CO may be treated to have lower resistance using the second insulating film 12 as a mask. This treatment is performed through, for example, a reducing gas plasma process such as a hydrogen plasma process with respect to the exposed oxide semiconductor layer CO. The exposed oxide semiconductor layer CO is reduced by reducing hydrogen plasma and thus has lower resistance. The oxide semiconductor layer CO in the area covered with the second insulating film 12 is not reduced and thus has relatively high resistance. Consequently, the semiconductor layer SC is obtained from the oxide semiconductor layer CO. The method for achieving low resistance is not limited to the above and may be performed through any optional method such as reduction by UV light irradiation.

During the above process, patterning of the insulating film and lowering the resistance of the oxide semiconductor layer CO can be achieved at the same time. Specifically, the insulating film is patterned by reactive ion etching (RIE) which is a kind of plasma dry etching. The etching gas used here may be a gas containing reducing fluorine or hydrogen. The etching gas is a gaseous mixture of methane tetrafluoride (CF4) and oxygen, or a gaseous mixture of perfluorocyclobutane (C4F8), hydrogen, and argon. Thus, the oxide semiconductor layer CO is reduced by fluorine plasma or hydrogen plasma during the patterning of the insulating film and the metal film. The resistance of the oxide semiconductor layer CO may not be lowered sufficiently by such a gas for dry etching. However, the oxide semiconductor layer CO with such auxiliary lowered resistance in the dry etching process is useful to reduce the workload of the resistance lowering process performed later.

FIG. 8 shows that the process proceeds to the formation of the third insulating film 13. As shown in the FIGS. 8A and 8B, the gate electrode WG is formed, and then, the third insulating film 13 is formed on the first insulating film 11 through a plasma CVD method to cover the first insulating film 11, semiconductor layer SC, and gate electrode WG, and side surfaces of the second insulating film 12.

FIG. 9 shows that the process proceeds to the formation of contact holes CH1, CH2, and CH3 in the third insulating film 13. As in the FIG. 9A, contact holes CH2 and CH3 are formed in the third insulating film 13 to reach the semiconductor layer SC. As in the FIG. 9B, contact hole CH1 is formed in the first insulating film 11 and the third insulating film 13 to reach the light shielding layer LS. Contact hole CH1 is etched one-layer deeper as compared to contact holes CH2 and CH3 to reach the first insulating film 11. The semiconductor layer SC is formed of an oxide semiconductor and is basically untouched by etching. Thus, the semiconductor layer SC can function as a stopper. Therefore, etching of contact holes CH2 and CH3 is stopped at the semiconductor layer SC and does not go below the semiconductor layer SC. On the other hand, since contact hole CH1 does not overlap the semiconductor layer SC, etching of contact hole CH1 is not stopped by the semiconductor layer SC and goes to the light shielding layer LS. With this mechanism, contact holes CH1 to CH3 are formed at the same time through the same etching process in the present embodiment. Furthermore, since the gate electrode WG is not etched, the upper surface WGa and side surface WGc are exposed in contact hole CH1.

FIG. 10 shows that the process proceeds to the formation of the source electrode 15A, drain electrode 15B, and connection electrode EL. As in the FIG. 10A, the source electrode 15A and the drain electrode 15B are formed on the third insulating film 13. As in the FIG. 10B, the connection electrode EL is formed on the third insulating film 13.

The metal film formed of molybdenum, tungsten, or the like is formed on the third insulating film 13, and is filled in contact holes CH1, CH2, and CH3. Then, the metal oxide is patterned in an island shape to form the source electrode 15A, drain electrode 15B, and connection electrode EL through the same process.

In the present embodiment, the gate electrode WG and the light shielding layer LS are electrically connected through the connection electrode EL formed in contact hole CH1. Thereby, the potential of the light shielding layer LS is fixed to that of the gate electrode and a potential fluctuation of the light shielding layer LS can be suppressed. Furthermore, the light shielding layer LS includes projection LSa which projects from the area where the light shielding layer LS and the gate electrode WG overlap as shown in FIG. 2. Contact hole CH1 is formed on projection LSa. Thus, the electrical connection of the gate electrode WG and the light shielding layer LS can be achieved within a small area in the proximity of the overlapping area thereof. The connection electrode EL can be formed without affecting high definition performance of the display device.

Furthermore, during the manufacture of the array substrate, contact hole CH1 is formed with contact holes CH2 and CH3 through the same manufacturing process. The connection electrode EL is formed with the source electrode 15A and drain electrode 15B with the same material through the same process. Therefore, both the connection electrode EL and thin-film transistor TR1 can be formed through the same process and the electrical connection of the gate electrode WG and the light shielding layer LS can be achieved in the same process. That is, there is no need of performing an additional film formation process or an exposure etching process for the connection electrode EL, and coupling of the light shielding layer LS can be suppressed cost-effectively.

Therefore, the present embodiment can present a display device which can suppress light leakage current and which can suppress the coupling of the light shielding layer cost-effectively.

Now, a variation of the present embodiment will be explained.

FIG. 11A is a plan view which shows a thin-film transistor TR2 in the peripheral circuit portion of a display device of a first variation, FIG. 11B is a cross-sectional view which shows a display panel PNL taken along line XIa-XIa of the FIG. 11A, and FIG. 11C is a cross-sectional view which shows thin-film transistor TR2 taken along line XIb-XIb of the FIG. 11B.

In the first variation, a gate line G is shaped differently from the gate line of the above embodiment. As in the FIG. 11A, the gate line G bends at the right angle at the position of thin-film transistor TR1 to extend over the semiconductor layer SC. The gate line G extending over the semiconductor layer SC is a gate electrode WG.

As in the FIGS. 11B and 11C, an array substrate AR of this variation is structured substantially the same as the array substrate AR except for the gate line G, and thus, can be formed through the same process as with the above embodiment.

The display device of the first variation can achieve the same advantages as that of the above embodiment.

Figure 12:
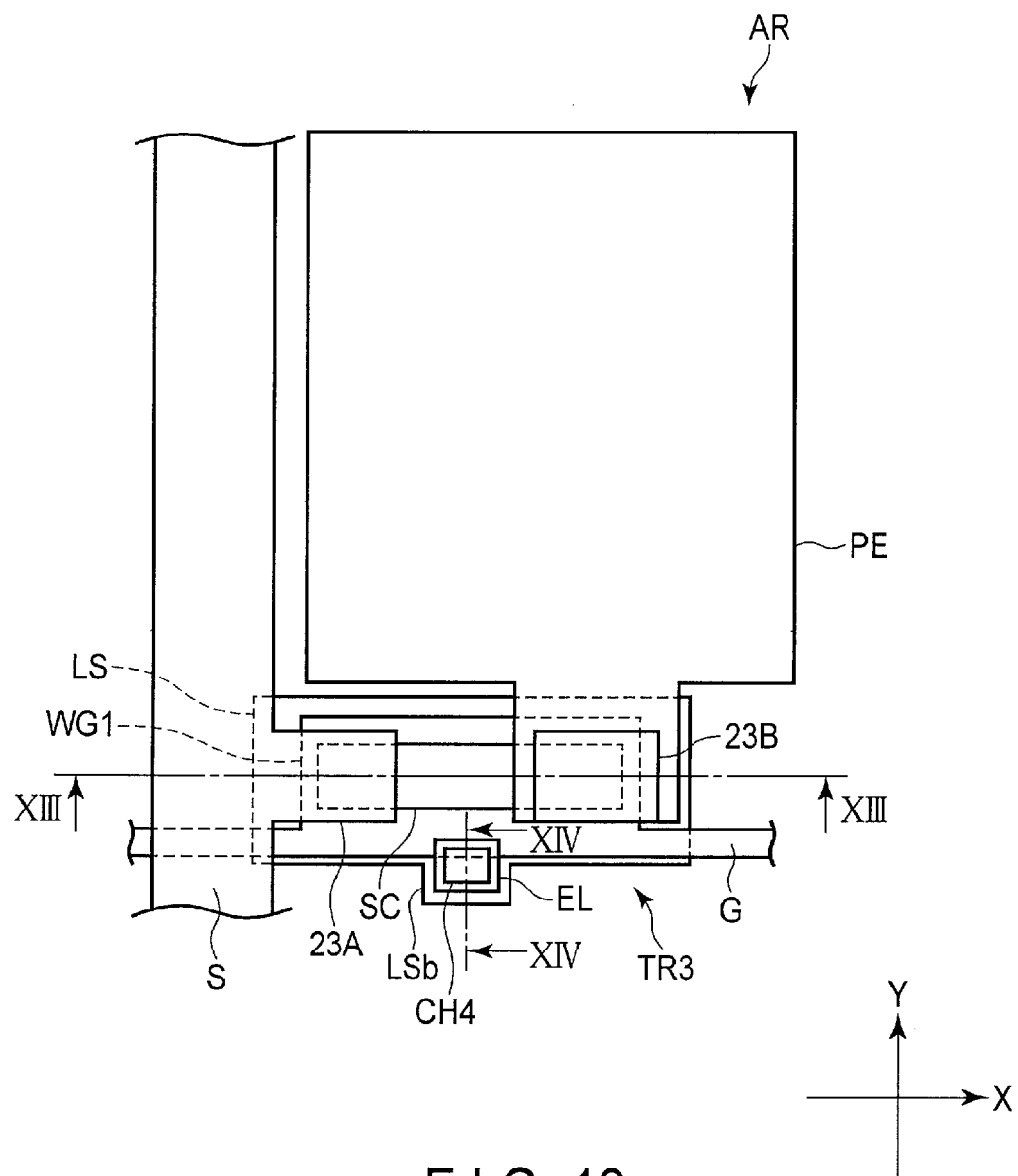
FIG. 12 is a schematic cross-sectional view which shows a display device of a second variation.
Figure 13:
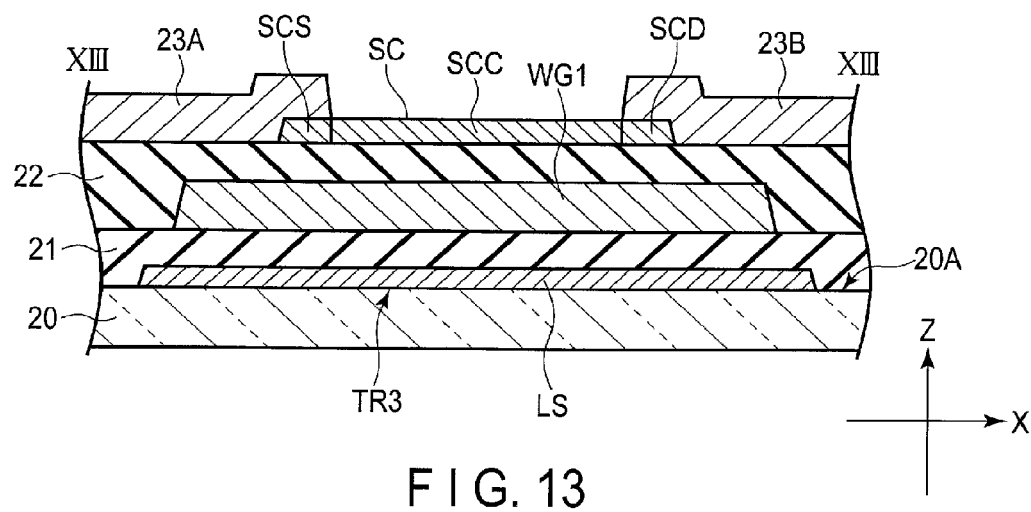
FIG. 13 is a cross-sectional view which shows an array substrate taken along line XIII-XIII of FIG. 12.
Figure 14:
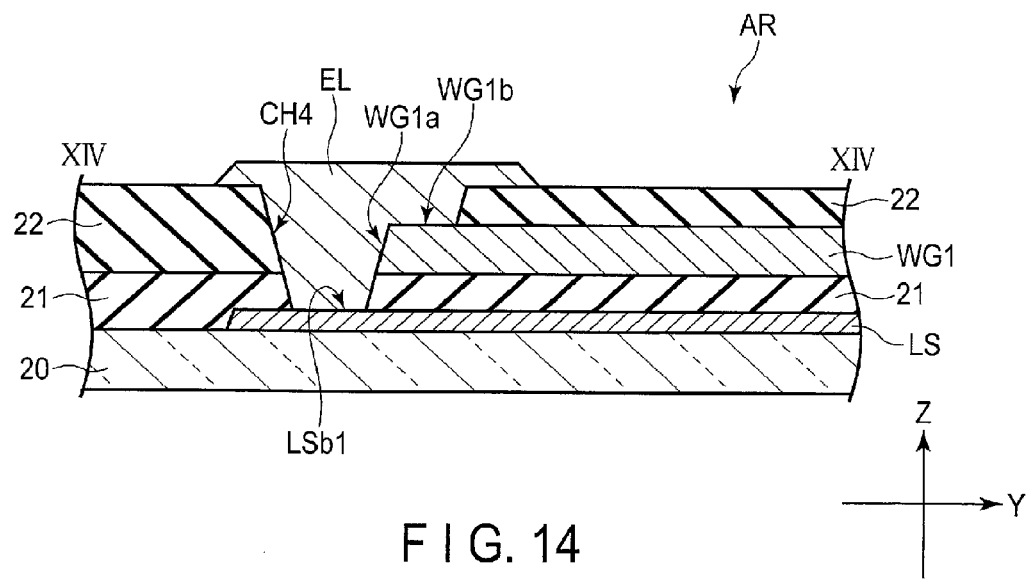
FIG. 14 is a cross-sectional view which shows the array substrate taken along line XIV-XIV of FIG. 12.

FIG. 12 is a plan view which shows an array substrate AR of a display device of a second variation. FIG. 13 is a cross-sectional view which shows the array substrate AR taken along line XIII-XIII of FIG. 12, and FIG. 14 is a cross-sectional view which shows the array substrate AR taken along line XIV-XIV of FIG. 12. Comparing the second variation as in FIG. 12 to the above embodiment, the second variation has a bottom-gate thin-film transistor TR3.

As in FIG. 12, thin-film transistor TR3 is disposed in the proximity of a crossing point of a gate line G and a source line S, and is electrically connected to the gate line G and the source line S. Thin-film transistor TR3 includes a semiconductor layer SC, gate electrode WG1 formed integrally with a gate line G, source electrode (first electrode) 23A formed integrally with the source line S, and drain electrode (second electrode) 23B. The source electrode 23A is electrically connected to the semiconductor layer SC. The drain electrode 23B is formed in an island shape and is electrically connected to the semiconductor layer SC. The gate electrode WG1 projects from the gate line G in the second direction Y to overlap a layer above the semiconductor layer SC.

The pixel electrode PE is electrically connected to the drain electrode 23B of thin-film transistor TR3 through a contact hole which is not shown.

The light shielding layer LS overlaps the semiconductor layer SC and the gate electrode WG. A projection LSb is formed on the light shielding layer LS to project from the area overlapping the gate electrode WG. Projection LSb extends in a second direction Y which is orthogonal to the longitudinal direction (first direction X) of the semiconductor layer SC, and extends in an area overlapping the gate line G. The connection electrode EL is formed in an island shape and is electrically connected to the gate electrode WG and the light shielding layer LS through a contact hole CH4 formed in projection LSb. That is, the gate electrode WG and the light shielding layer LS are electrically connected to the connection electrode EL. The connection electrode EL contacts the upper surface and side surface of the gate electrode WG and the upper surface of projection LSb.

As in FIG. 13, the array substrate AR includes an insulating substrate 20, light shielding layer LS, light shielding insulating film 21, thin-film transistor TR3, and the like. The light shielding layer LS is formed on an upper surface 20A of the insulating substrate 20. The light shielding layer LS is covered with the light shielding insulating film 21. Thin-film transistor TR3 is formed above the light shielding layer LS and functions as a switching element. Thin-film transistor TR3 includes a gate electrode WG1, gate insulating film 22, semiconductor layer SC, source electrode (first electrode) 23A, and drain electrode (second electrode) 23B.

The gate electrode WG1 is formed on the light shielding film 21. The gate insulating film 22 is formed on the gate electrode WG1. The gate insulating film 22 is formed on the light insulating film 21. The semiconductor layer SC is formed on the upper surface of the gate insulating film 22. The semiconductor layer SC includes a source region SCS, drain region SCD, and channel region SCC. The channel region SCC is disposed between the source region SCS and the drain region SCD. The source region SCS and the drain region SCD are formed to have lower resistance as compared to the channel region SCC. The light shielding layer LS is formed between thin-film transistor TR3 and the insulating substrate 10, and is opposed at least the channel region SCC of the semiconductor layer SC.

In this variation, the semiconductor layer SC is formed of an oxide semiconductor. Note that the light shielding insulating film 21 is a first insulating film, and the gate insulating film 22 is a second insulating film.

The source electrode 23A is formed on the gate insulating film 22 and is also on the semiconductor layer SC. The drain electrode 23B is formed on the gate insulating film 22 and is also on the semiconductor layer SC. As above, thin-film transistor TR3 is a bottom-gate thin-film transistor.

As in FIG. 14, a contact hole CH4 is pierced through the light shielding insulating film 21 and the gate insulating film 22. The connection electrode EL is formed on the upper surface of the gate insulating film 22 toward the inside of contact hole CH4. The upper surface WG1a and side surface WG1c of the gate electrode WG1 are exposed in contact hole CH4, and the connection electrode EL contacts the semiconductor layer SC and the upper surface WG1a and side surface WG1c of the gate electrode WG1 inside contact hole CH4. The connection electrode EL contacts the upper surface LSb1 of projection LSb of the light shielding layer LS as in FIG. 12. That is, in the second variation, the gate electrode WG1 and the light shielding layer LS are electrically connected by the connection electrode EL, and the potential of the light shielding layer LS is fixed to be substantially equal to that of the gate electrode WG. The connection electrode EL, source electrode 23A, and drain electrode 23B are formed of the same material.

Now, a manufacturing process of the array substrate AR will be explained with reference to FIGS. 15 to 19. FIGS. 15 to 19 are cross-sectional views which show a manufacturing method of the array substrate AR of this variation. In the manufacturing process of each of FIGS. 15 to 19, FIGS. 15A, 16A, 17A, 18A and 19A are a cross-sectional views of the array substrate AR of FIG. 12 taken along line XIII-XIII, and FIGS. 15B, 16B, 17B, 18B and 19B is a cross-sectional view of the array substrate AR of FIG. 12 taken along line XIV-XIV. The formation of each member is performed in a similar manner to that of the above embodiment, and hereinafter only the parts unique to the bottom-gate thin-film transistor will be explained.

As in the FIGS. 15A and 15B, a light shielding layer LS is formed on an insulating substrate 20.

FIG. 16 shows that the process proceeds to the formation of the gate electrode WG1. The light shielding insulating film 21 covers the light shielding layer LS and is formed on the insulating substrate 20. After the formation of the light shielding insulating film 21, a metal film for gate electrode WG is formed on the light shielding insulating film 21 as in the FIGS. 16A and 16B. The metal film is patterned to form the gate electrode WG.

FIG. 17 shows that the process proceeds to the formation of the gate insulating film 22. As in the FIGS. 17A and 17B, the gate insulating film 22 are formed to cover the date electrode WG1 and the light shielding insulating film 21.

Figure 18A:
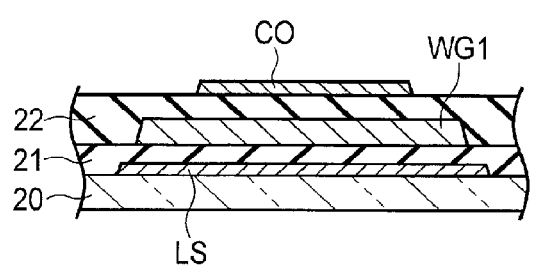
FIGS. 18A and 18B are cross-sectional views which shows the manufacturing method of the thin-film transistor of FIGS. 13 and 14, subsequently to FIG. 17.
Figure 18B:
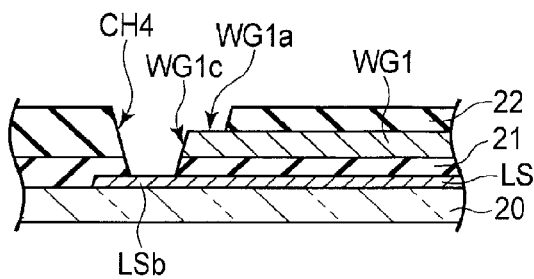

FIG. 18 shows that the process proceeds to the formation of the oxide semiconductor layer CO. A contact hole CH4 in the FIG. 18B is formed through the same process as in the above embodiment as shown in FIG. 8. In this variation, the gate electrode WG is not etched, and the upper surface WG1a and side surface WG1c of the gate electrode WG1 are exposed in contact hole CH4. Then, the oxide semiconductor layer CO is formed on the gate insulating film 22 as in the FIG. 18A.

Figure 19A:
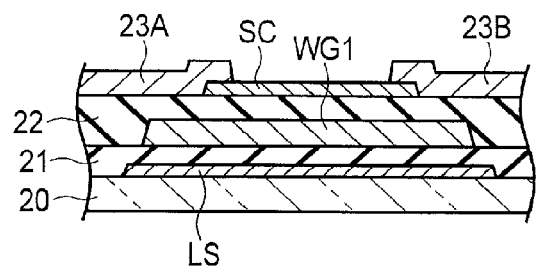
FIGS. 19A and 19B are cross-sectional views which shows the manufacturing method of the thin-film transistor of FIGS. 13 and 14, subsequently to FIG. 18.
Figure 19B:
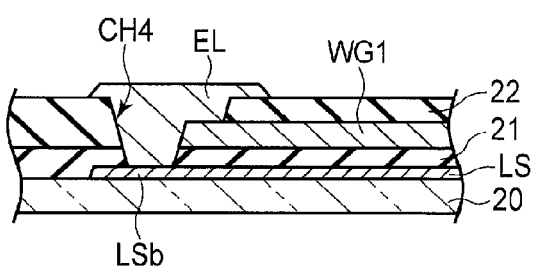

FIG. 19 shows that the process proceeds to the formation of the source electrode 23A, drain electrode 23B, and connection electrode EL. As in the FIG. 19A, the source electrode 23A and the drain electrode 23B are formed on the gate insulating film 22. As in the FIG. 19B, the connection electrode EL is formed on the gate insulating film 22.

As in the FIGS. 19A and 19B, a metal film is formed on the gate insulating film 22 and the oxide semiconductor layer CO and inside contact hole CH4. The metal film is patterned into an island shape, and the source electrode 23A, drain electrode 23B, and connection electrode EL are formed through the same process. In the FIG. 19A, the metal film is patterned to be divided in an area opposed to the gate electrode WG1 to form the source electrode 23A and the drain electrode 23B. The part of the oxide semiconductor layer CO which is not covered with the source electrode 23A or the drain electrode 23B is subjected to an oxidation reduction process and the semiconductor layer SC is formed.

In the display device of the second variation, the gate electrode WG and the light shielding layer LS are electrically connected through the connection electrode EL formed inside contact hole CH4. Thereby, the potential of the light shielding layer LS is fixed to that of the gate electrode and a potential fluctuation of the light shielding layer LS can be suppressed. Furthermore, the light shielding layer LS includes projection LSb which projects from the area where the light shielding layer LS and the gate electrode WG overlap. Contact hole CH4 is formed on projection LSb. Thus, the electrical connection of the gate electrode WG and the light shielding layer LS can be achieved within a small area in the proximity of the overlapping area thereof. The connection electrode EL can be formed without affecting high definition performance of the display device.

FIG. 20A is a plan view which shows a thin-film transistor TR4 of a display device of a third variation, FIG. 20B is a cross-sectional view which shows a display panel PNL taken along line XXa-XXa of the FIG. 11A, and FIG. 20C is a cross-sectional view which shows the display panel taken along line XXb-XXb of the FIG. 11A.

In the third variation, a gate electrode WG1 is shaped differently from that of thin-film transistor TR3 of the second variation. As in the FIG. 20A, the gate line G extends substantially vertically from the gate electrode WG1 in the third variation. As in the FIGS. 20B and 20C, the other structures of the array substrate AR are the same as that of the array substrate AR of the second variation, and the array substrate AR is formed through the same process as that of the second variation.

The display device of the third variation can achieve the same advantages as that of the above second variation.

As can be understood from the above, the present embodiment and its variations can present a display device which can suppress light leakage current and which can suppress the coupling of the light shielding layer cost-effectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
an insulating substrate;
a thin-film transistor including a semiconductor layer formed on a layer above the insulating substrate, a gate electrode which at least partly overlaps the semiconductor layer, and a first electrode and a second electrode which are electrically connected to the semiconductor layer;
a light shielding layer formed between the thin-film transistor and the insulating substrate to at least partly overlap the semiconductor layer, the light shielding layer electrically connected to the gate electrode;
a first insulating film covering the light shielding layer;
a second insulating film covering the gate electrode; and
a connection electrode passing through a first contact hole pierced through the first insulating film and the second insulating film, the connection electrode connecting the gate electrode and the light shielding layer, wherein
the connection electrode contacts an upper surface and a side surface of the gate electrode.

2. The display device of claim 1, wherein the light shielding layer includes a projection projecting from an area opposed to the gate electrode, and the connection electrode contacts an upper surface of the projection.

3. The display device of claim 2, wherein the projection projects in a second direction which is orthogonal to a longitudinal direction of the semiconductor layer.

4. The display device of claim 1, wherein the semiconductor layer is formed of an oxide semiconductor.

5. A display device comprising:
an insulating substrate;
a thin-film transistor including a semiconductor layer formed on a layer above the insulating substrate, a gate electrode which is formed on a layer above the semiconductor layer and at least partly overlaps the semiconductor layer, and a first electrode and a second electrode which are electrically connected to the semiconductor layer;
a light shielding layer formed between the thin-film transistor and the insulating substrate to at least partly overlap the semiconductor layer, the light shielding layer electrically connected to the gate electrode;
a first insulating film covering the light shielding layer;
a second insulating film covering the gate electrode; and
a connection electrode passing through a first contact hole pierced through the first insulating film and the second insulating film, the connection electrode connecting the gate electrode and the light shielding layer, wherein
the connection electrode contacts an upper surface and a side surface of the gate electrode.

6. The display device of claim 5, wherein the second insulating film covers the semiconductor layer.

7. The display device of claim 5, wherein the first electrode is connected to the semiconductor layer through a second contact hole pierced through the first insulating film and the second insulating film, the second electrode is connected to the semiconductor layer through a third contact hole pierced through the first insulating film and the second insulating film, and the first electrode, second electrode, and connection electrode are all formed of the same material.

* * * * *